United States Patent [19]
Hobler et al.

[11] Patent Number: 6,144,073
[45] Date of Patent: Nov. 7, 2000

[54] MONOLITHICALLY-INTEGRATED STATIC RANDOM ACCESS MEMORY DEVICE

[75] Inventors: Gerhard Hobler, Klosterneuburg, Austria; Marco Mastrapasqua, Annandale; Mark Richard Pinto, Summit, both of N.J.; Enrico Sangiori, Forli, Italy

[73] Assignee: Lucent Technologies Inc., Murray Hill, N.J.

[21] Appl. No.: 09/311,822

[22] Filed: May 13, 1999

[51] Int. Cl.[7] .......................... H01L 27/01; H01L 27/12; H01L 31/0392; H01L 29/76; H01L 29/94

[52] U.S. Cl. .................... 257/347; 257/350; 257/351; 257/354; 257/369

[58] Field of Search .................................. 257/327, 903, 257/250, 366, 387, 296, 347, 351, 354, 350

[56] References Cited

U.S. PATENT DOCUMENTS

| | | | |
|---|---|---|---|
| 3,969,708 | 7/1976 | Sonoda | 340/173 FF |
| 5,095,347 | 3/1992 | Kirsch | 357/23.7 |
| 5,306,906 | 4/1994 | Aoki et al. | 250/208.1 |
| 5,438,538 | 8/1995 | Hashimoto | 365/154 |

*Primary Examiner*—David Hardy
*Assistant Examiner*—Jesse A Fenty
*Attorney, Agent, or Firm*—Mathews, Collins, Shepherd & Gould, P.A.

[57] ABSTRACT

A monolithically-integrated SRAM cell is described for reducing the cell size, i.e., at least two of a plurality of transistors comprising the SRAM cell are monolithically integrated to define a first transistor and a second transistor, wherein the drain of the first transistor functions as the gate of the second transistor and the drain of the second transistor functions as the gate of the first transistor. This integration eliminates the need for gate-to-drain connections of previous devices.

16 Claims, 5 Drawing Sheets

MONOLITHICALLY-INTEGRATED STATIC RANDOM ACCESS MEMORY DEVICE

FIELD OF THE INVENTION

The present invention relates to semiconductor devices and, more particularly, to a static random access memory cell comprising monolithically-integrated transistors and a method of making same.

BACKGROUND OF THE INVENTION

The metal-oxide semiconductor field-effect transistor (MOSFET or MOS device) is a dominant and important device in fabricating memory devices and integrated circuits, and various types of MOSFETS are known. MOSFET technology includes NMOS and CMOS technology, the former comprising n-channel MOS devices and the latter comprising n-channel and p-channel devices integrated on the same chip. Other acronyms are used to identify MOSFETs, including DMOS (wherein "D" stands for "diffusion" or "double diffusion"), PMOS (p-channel MOS), IGBT (Insulated Gate Bipolar Transistor), BiCMOS (CMOS having bipolar devices), and DGDMOS (Dual Gate DMOS).

MOS devices may be integrated together or with other components or devices to form memory cells. Static random access memory (SRAM) cells are commonly used as embedded memory because they are fast, dissipate low power, and easy to use. In comparison, dynamic random access memory (DRAM) and flash electrically-programmable read-only memory (EPROM) cells require overhead circuitry and additional processing costs as compared with SRAM cells. However, a disadvantage of SRAM cells is that traditionally they have required six transistors of which two are PMOS, whereas a DRAM cell needs only one transistor and one capacitor. A schematic circuit representation of a six-transistor SRAM is shown in FIG. 1, including two n-type drive transistors $M_1$ and $M_2$, where the gate of one transistor is connected to the gate of the other transistor with metal line 8.

Efforts thus have been addressed to reducing the cell size of SRAM's. For example, U.S. Pat. No. 5,438,538 to Hashimoto, "Static Random Access Memory for Gate Array Devices," assigned to Texas Instruments Inc. (incorporated herein), shows a SRAM cell comprising two n-channel pass gate transistors, two n-channel drive transistors, and two p-channel transistors, with a resistance element connecting the p-channel transistors to effectively reduce the size of these transistors below the size of the drive transistors. U.S. Pat. No. 5,867,443 to Linderman, "Shared Bitline Heterogeneous Memory," issued Feb. 2, 1999, shows a five-transistor SRAM cell accessed by a bitline merged with heterogeneous memories, such as EPROMs and DRAMS.

Vertical integration is also a viable approach for reducing cell size. An early solution involved using polysilicon resistors as the load and fabricating them on top of the NMOS transistors. The need to decrease the power and increase the stability to noise and soft errors inspired use of a full CMOS cell design. A useful design involved forming two PMOS load transistors in a polysilicon layer above four NMOS transistors in the substrate. See M. Ando, T. Okazawa, H. Furuta et al., "A 0.1 µA Standby Current Bouncing Noise-Immune 1Mb SRAM," TECH. DIGEST SYMP VLSI CIRCUITS (1988), p. 49. As may be appreciated, those concerned with semiconductor technologies continue to search for new SRAM designs having smaller sizes and increased or comparable performance.

SUMMARY OF THE INVENTION

Summarily described, the invention embraces a SRAM cell having a plurality of transistors, wherein at least two of the plurality of transistors are monolithically integrated. Each of the two monolithically-integrated transistors has a source, a drain, a channel and a gate. The integrated transistors have an insulating layer disposed between the channel of the first transistor and the channel of the second transistor. The drain of the first transistor functions as the gate of the second transistor, and the drain the second transistor functions as the gate of the first transistor. This integration eliminates the need for a drain-to-gate connection as in previous devices and thereby reduces cell size.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and except for the graphs are not to scale.

DETAILED DESCRIPTION OF THE INVENTION

Figure 1:
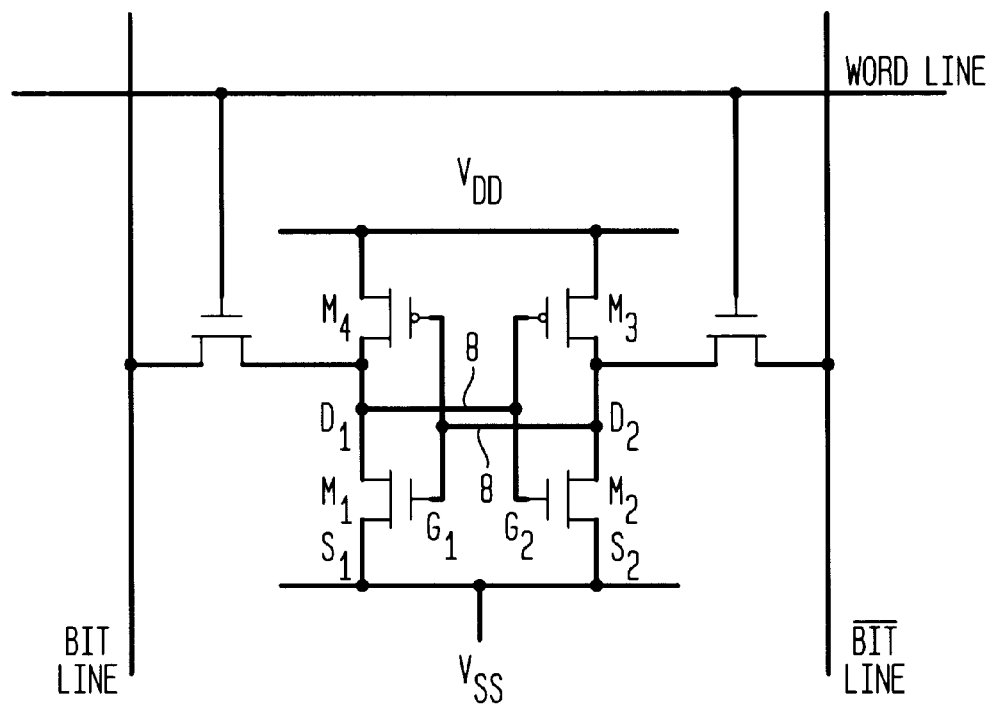
FIG. 1 is a schematic circuit representation of a prior art CMOS SRAM cell having six transistors.
Figure 2:
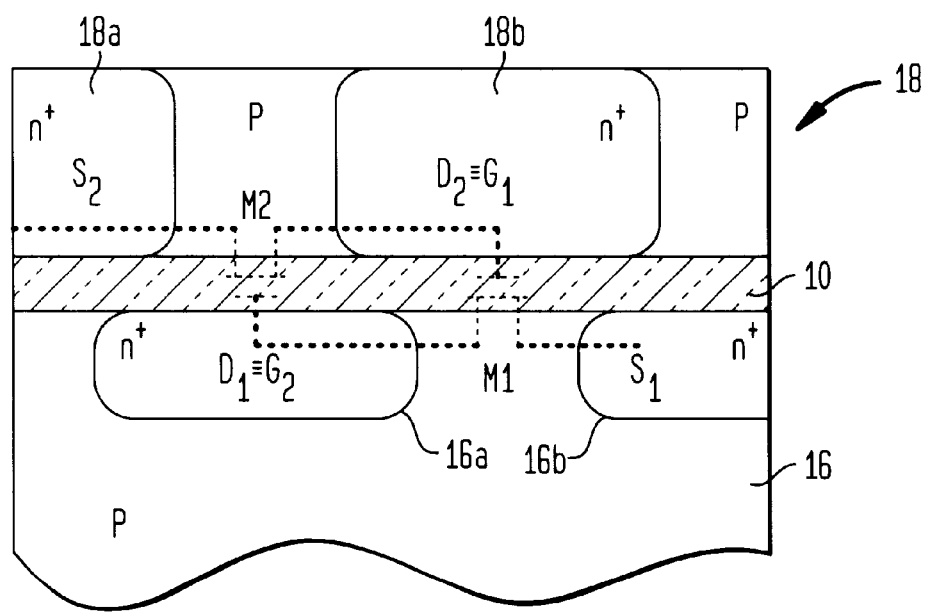
FIG. 2 is a schematic circuit representation of monolithically integrated transistors which may be incorporated as part of a SRAM cell.

With this invention, a compact SRAM cell is provided which comprises monolithically integrated transistors and eliminates the need for an external drain-to-gate connection (e.g. metal line 8 of FIG. 1). A schematic representation of one embodiment of the integrated transistors for use as part of an inventive SRAM cell is shown in FIG. 2. As can be seen, drive transistors 16, 18 are built on opposite sides of a gate oxide layer 10. In this integration scheme, the drain $D_1$ of the $M_1$ transistor 16 functions as the gate $G_2$ of the $M_2$ transistor 18, while the drain $D_2$ of the $M_2$ transistor 18 functions as the gate $G_1$ of the $M_1$ transistor 16. The insulating layer 10 (also referred to herein as the gate oxide layer 10) separates the two channels. The connection between the drain of one transistor and the gate of the other is not necessary because the drain replaces and functions as the gate of the other transistor. Eliminating the drain-to-gate connections and the integration structure reduces cell size, where the extent of reduction depends upon the layout, type of isolation, and contacts used.

To complete the SRAM cell, access transistors and the load (not shown in FIG. 2) are connected to the drain of $M_1$ and $M_2$. The load may be a polysilicon resistor or, as in FIG.

1, a PMOS transistor, either bulk or thin-film. The invention is described herein with reference to the integration of two NMOS drive transistors forming the "flip-flop" configuration of FIG. 2. However, it should be understood that the integration scheme could also be applied to two PMOS devices acting as loads or to a PMOS and NMOS device. For example, FIG. 1 shows two NMOS drive transistors $M_1$ and $M_2$, and two PMOS devices $M_3$ and $M_4$. FIG. 2 shows integration of the NMOS transistors $M_1$ and $M_2$, but the integration may be formed between $M_3$ and $M_4$, $M_2$ and $M_4$, or $M_1$ and $M_3$, although one skilled in the art would appreciate that the doping levels would differ depending upon the particular integration.

The description below is divided into two sections. In section A, a process for obtaining the desired integrated transistor structure is described, with an example being given of the processing of a particular embodiment together with simulation results. In section B, the simulated device and SRAM cell characteristics are described.

A. Process description

The integrated transistor structure of FIG. 2 may be made by forming a thin insulating layer, e.g., a thin layer of oxide, on a single crystal semiconductor substrate (e.g., silicon) and forming a second layer of single crystal semiconductor substrate over the insulating layer. Although the invention is described with reference to use of silicon as the semiconductor material, it is of course understood that other semiconductor materials known in the field may be used as well. Dopants are implanted into the three-layer structure to form source and drain regions. Processes for forming the semiconductor and insulating layers are well-known in the field and described in the literature. See, e.g., U.S. Pat. No. 5,670,396, "Method of Forming a DMOS-Controlled Lateral Bipolar Transistor," issued Sep. 23, 1997; U.S. Pat. No. 5,557,125, "Dielectrically Isolated Semiconductor Devices Having Improved Characteristics," issued Sep. 17, 1996; U.S. Pat. No. 5,541,409, cited above; U.S. Pat. No. 5,395,776, "Method of Making a Rugged DMOS Device," issued Mar. 7, 1995; U.S. Pat. No. 5,381,031, "Semiconductor Device With Reduced High Voltage Termination Area and High Breakdown Voltage," issued Jan. 10, 1995, all of which issued to Muhammed A. Shibib, were assigned to Lucent Technologies, Inc., the assignee herein, and are incorporated herein. See also U.S. Pat. No. 5,171,699, "Vertical DMOS Transistor Structure Built in an N-Well CMOS-Based BiCMOS Process and Method of Fabrication," issued Dec. 15, 1992 to Hutter et al., assigned to Texas Instruments, Inc.; U.S. Pat. No. 5,374,569, "Method for Forming a BiCDMOS," issued Dec. 20, 1994 to Yilmaz et al., assigned to Siliconix Inc.; U.S. Pat. No. 5,591,657, "Semiconductor Apparatus Manufacturing Method Employing Gate Side Wall Self-Aligning for Masking," issued Jan. 7, 1997, to Fujishima et al., assigned to Fuji Electric Co., Ltd, which also are incorporated herein.

In achieving the structure of FIG. 2, two special considerations relate to the epitaxy of the multilayer structure and the desired doping profiles. Selective epitaxial lateral overgrowth (ELO) may be applied to provide the semiconductor layer on top of the gate insulator. In ELO, single crystal material is grown from oxide-masked seed windows. After reaching the top of the opening, the growth proceeds laterally as well as vertically, forming silicon on the insulating layer. See J. P. Denton and G. W. Neudeck, "*Fully Depleted Dual Gated Thin Film SOI PMOSFETS Fabricated In SOI Islands With An Isolated Buried Polysilicon Backgate,*" IEEE ELECTRON DEV. LETT. Vol. 17 (1996), at p. 509, which is incorporated herein by reference.

To achieve a suitable doping profile, once the three layers are formed, dopants may be implanted along select channeling directions. The top layer is an epitaxial Si layer that crystallizes in a known orientation. The use of implants along channeling directions allows doping the source and drain region for the first 16 and second 18 transistors (FIG. 2) with the same mask. The insulating (or gate oxide) layer 10 will serve to "dechannel" the dopants, and the thickness of the insulating layer can be selected to provide the desired dechanneling. The thickness of the insulating layer is determined by the channel length, the need to dechannel the doping during implant, and the implant energy. A suitable range of oxide thicknesses for satisfying these parameters is about 2 to 10 nm. Use of ELO is suitable for forming an oxide layer of the selected thickness, although other techniques suitable for providing the layered structure are contemplated as well. Preferably, the $n^+$ dopants in both the first and second semiconductor layers (16, 18) are present in high concentrations at the interface with the insulating layer, while the concentrations of n-type dopants at the opposite sides of the oxide are kept negligible or at least sufficiently low to be compensated by the boron background doping. Use of implants along channeling directions is advantageous in achieving a large difference in concentrations above and below the gate oxide.

The structure of FIG. 2 may be obtained with a process that is independent of the method used to obtain the starting multi-layer material. The following example describes the processing of a specific embodiment of the invention which is intended to be exemplary to aid in understanding the invention and not limiting in nature.

EXAMPLE

In this example, it is assumed that the insulating layer (10 of FIG. 2) comprises a 6-nm thick silicon dioxide layer separating the transistors 16, 18, and that the transistors comprise two silicon layers, a second epitaxial Si (epi-Si) layer 18 which is about 250 nm thick and a bulk-Si layer 16. The bulk and epi-Si layers are in-situ boron doped to concentrations of about $10^{18}$ and $1.7 \times 10^{18}$ $cm^{-3}$, respectively. The second epi-Si layer preferably is doped slightly higher than the bulk-Si layer to compensate for n-type dopants that are unavoidably introduced to the epi-Si layer during the doping of the $n^+$ regions of the lower MOSFET.

The $n^+$ regions of the MOSFETs (16a, 16b, 18a, 18b), may be doped in a self-aligned manner using the same mask structure. Thus, the fabrication scheme not only reduces the processing cost but also allows for self-aligning the first and second transistors, which is important in operating the cell. The mask length and opening are about 250 nm.

Figure 3:
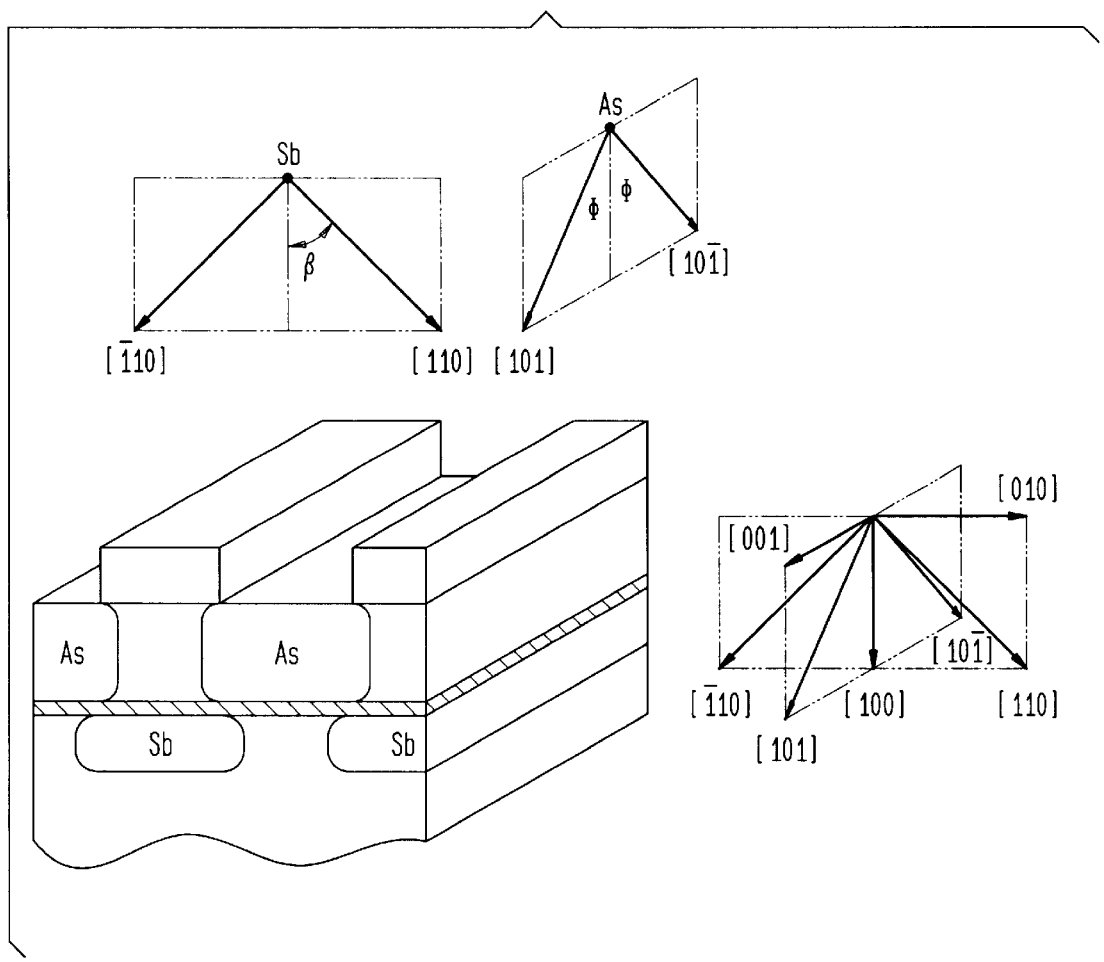
FIG. 3 is a schematic illustration of channeling directions for the implanting dopants in fabricating integrated transistors for use in a SRAM cell.

FIG. 3 schematically shows channeling directions of self-aligned implants for simultaneously doping the first and second layers. Arsenic (As) is implanted along the [101] and [10Ī] directions shown in FIG. 3 to form the $n^+$ regions in the epi-Si layer, and antimony (Sb) is implanted in the [110] and [Ī10] directions of FIG. 3 to form the $n^+$ regions in the bulk-Si. As can be seen, the [101] and [10Ī] directions are disposed along a latitudinal plane and displaced by an angle Φ of about 45 degrees from a vertical axial line running perpendicular to the surface of the second (upper) transistor, and the [110] and [Ī10] directions are disposed along a longitudinal plane and displaced by an angle β of about 45 degrees from a vertical axial line. There is some tolerance in the angle of implantation, e.g., 45±2 degrees is workable. The arsenic implantation may be performed at about 6 keV with $10^{15}$ $cm^{-2}$ As ions, and the antimony implantation may be performed at about 60 keV with $5 \times 10^{13}$ $cm^{-2}$ Sb ions. As one skilled in the field may appreciate, the energy level and concentration of dopants may be varied depending on the device structure, such as the thickness of the second (top) layer and the elements being implanted. The implant directions of As and Sb can be exchanged when the mask orientation is rotated by 90°. At the illustrative energy level of this example, a large fraction of the channeled ions penetrates through the epi-Si layer and is de-channeled at the gate oxide. Dechanneled ions have a much shorter range resulting in a correspondingly larger concentration of Sb ions below the oxide. Use of Sb as a dopant for the first (bottom) layer is preferred due to its small diffusivity and high ratio of channeled to random implantation range, although other dopants known in the field may be used as well. When Sb and As are used, it is also preferred that some Sb be implanted before the As.

Where the epi-Si layer thickness is about equal the mask length, the same mask structure may be used for the Sb implants (as for the As implants) to produce the laterally displaced $n^+$doping of the bulk-Si. The thickness of the mask may vary, but it should be sufficiently thick to stop implanted ions and yet sufficiently thin to avoid the shadowing effect that could corrupt the bulk-Si $n^+$regions. A mask having a thickness of about 95 nm is suitable for these purposes. The implantations should be performed at high temperature (e.g., at about 300–500° C. to avoid target amorphization that could inhibit the channeling effect. An exemplary time and temperature for activating and diffusing the dopants comprises a 5-minute furnace anneal at 1000° C.

Figure 4:
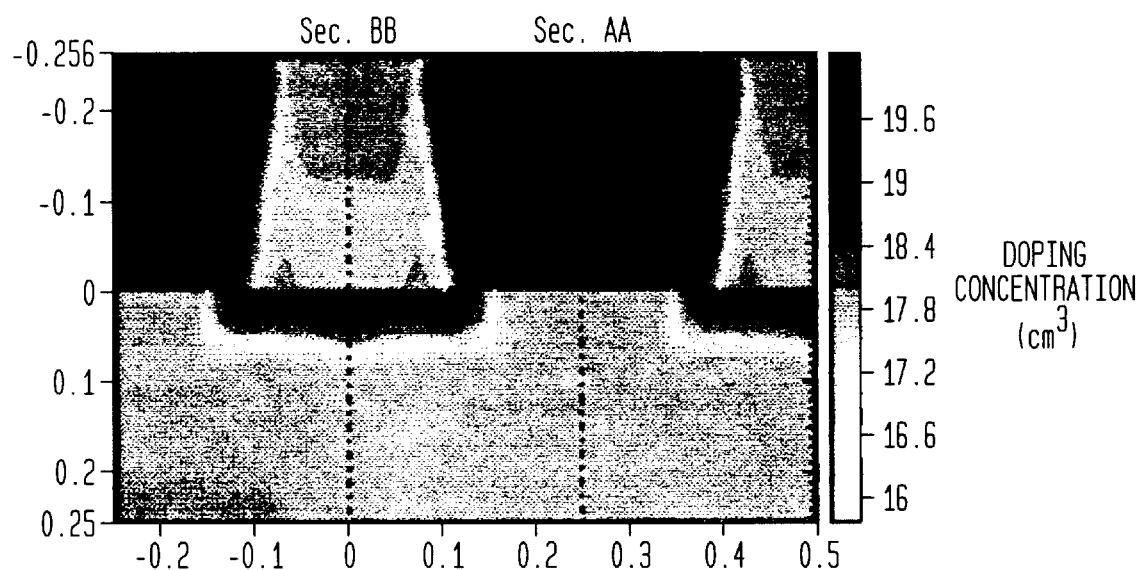
FIG. 4 illustrates a two-dimensional doping profile of the integrated transistors obtained by simulation and a partial differential equation solver.
Figure 5A:
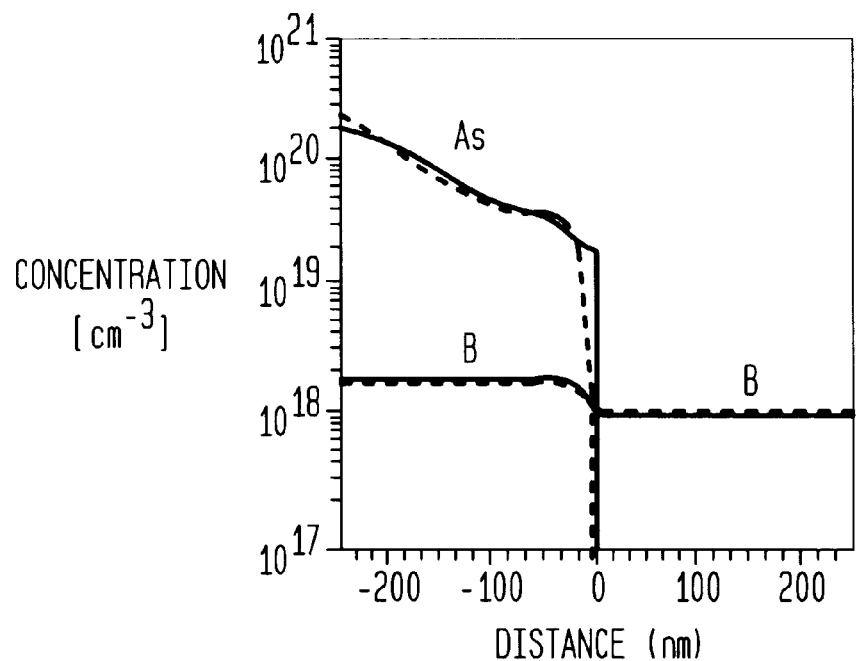
FIGS. 5A and 5B are graphs showing doping profiles of integrated transistors that have been doped as in FIG. 4 before (dashed lines) and after (solid lines) anneal, with FIG. 5A reflecting the profile along the line AA of FIG. 4 and FIG. 5B reflecting the profile long the line BB of FIG. 4.
Figure 5B:
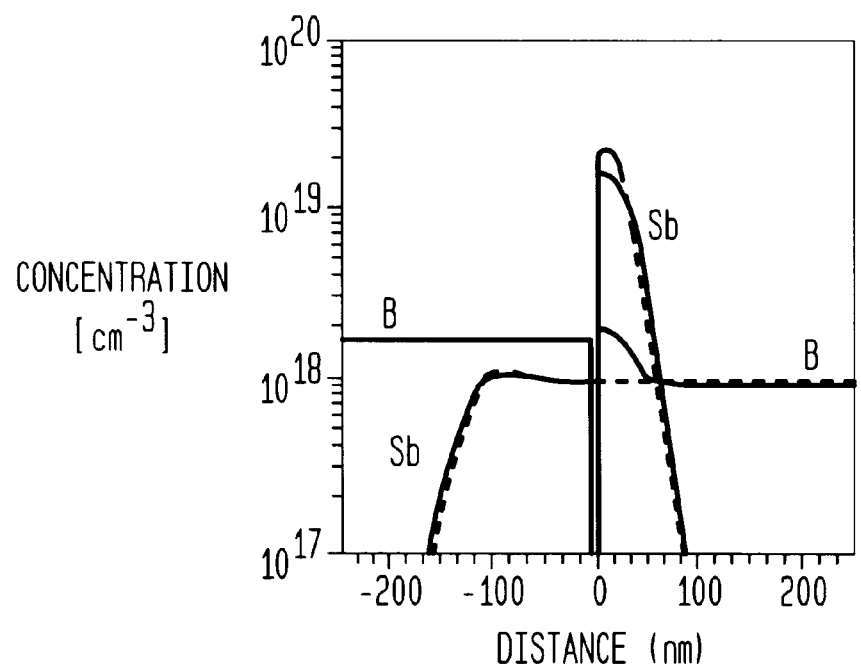

Referring to FIG. 4, there is shown a graph of a two-dimensional doping profile of the monolithically integrated transistors that may form the inventive SRAM cell. This profile was obtained by simulating the implants along the <110> directions with a Monte Carlo simulator IMSIL (see G. Hobler, "*Monte Carlo Simulation of Two-Dimensional Implanted Dopant Distributions at Mask Edges,*" *NUCL. INSTRUM. METH. B Vol.* 96 [1995] at p. 155, incorporated herein by reference), and by simulating the furnace anneal at 1000° C. for five minutes with the partial differential equation solver PROPHET (see M. R. Pinto et al., "*Three-Dimensional Characterization of Bipolar Transistors in a Submicron BiCMOS Technology Using Integrated Process and Device Simulation,*" IEDM TECH. DIGEST [1992], at p. 923) (hereinafter "PINTO I"). FIGS. 5A and 5B are graphs showing doping profiles of the integrated transistors doped as in FIG. 4 before (dashed lines) and after (solid lines) anneal. FIG. 5A reflects the profile along the line AA of FIG. 4, showing doping levels of arsenic (As) and boron (B), and FIG. 5B reflects the profile along the line BB of FIG. 4, showing doping levels of antimony (Sb) and boron (B). The before or "as-implanted" profiles (dashed lines) were simulated with IMSIL and the post-anneal or diff-used profiles (solid lines) were simulated with PROPHET.

FIGS. 5A and 5B illustrate that the exemplary 1000° C. anneal for 5 minutes is sufficient to bring a high concentration of As to the oxide, and yet, there is only moderate diffusion of the Sb profile. As seen in FIG. 5A, many dopants have penetrated close to the oxide due to the small stopping power of the <110>channels, as there was no implantation along the [010] direction and a small lateral extension of the two-dimensional dopant. The slope of the As profile near the oxide is much steeper than in conventional higher-energy tilted implantations. This slope allows a lower thermal budget to diffuse the dopants to the $Si/SiO_2$ interface and therefore reduces lateral diffusion. A high ratio of Sb doping before and after the oxide is preferred, i.e., the Sb doping level before the oxide should be minimized, and the Sb doping level after the oxide should be maximized. FIG. 5B reflects a ratio of Sb doping levels before and after the oxide of 25, which is advantageous and can be achieved with the parameters given in this Example.

B. Simulated Device and SRAM Cell Characteristics

The static and dynamic characteristics of a SRAM cell were simulated using the two-dimensional doping profile of integrated transistors as in FIG. 4 and the 2D drift-diffusion simulator PADRE (see PINTO I, supra). For simplicity, a passive load was assumed with the chosen value of the load 100 kΩ. The nominal transistor channel length L was 0.25 μm (as set by the mask parameters), while the transistor width W was 1 μm. Each drain was connected with the lump load element and the corresponding gate was stepped in voltage to obtain the I/O characteristics of the two inverters forming the SRAM cell.

Figure 6:
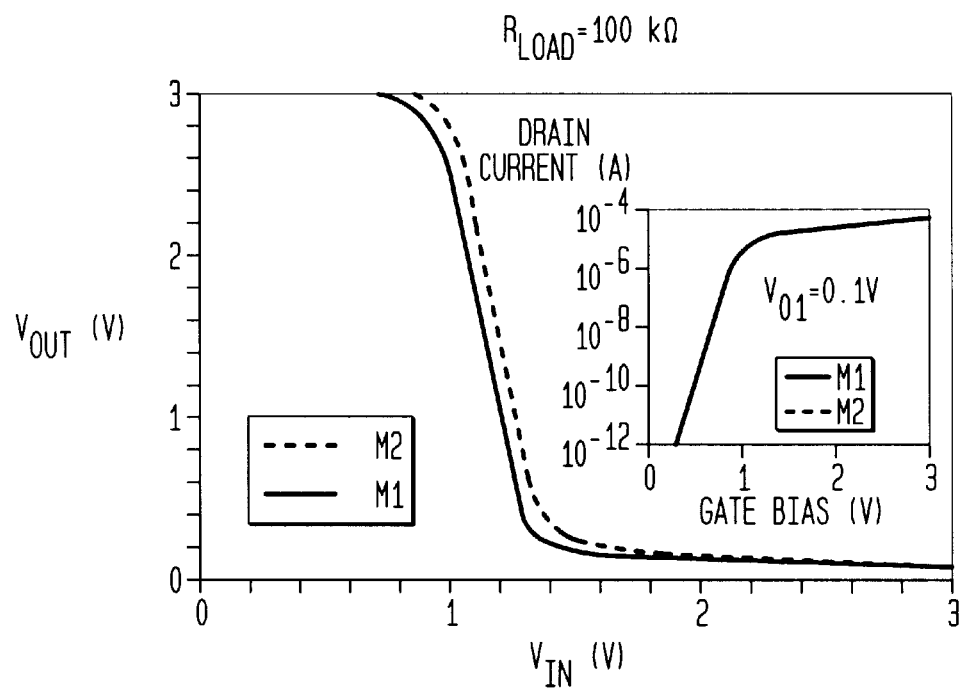
FIG. 6 is a graph showing the input-output characteristics of a SRAM cell having integrated transistors with the doping profile as shown in FIG. 4.

FIG. 6 shows the simulated transfer characteristics of the bulk-Si ($M_1$) and epi-Si ($M_2$) NMOS transistors. As can be seen, $M_1$ and $M_2$ exhibit very similar behavior, with negligible threshold voltage difference. The drive current capacity of $M_2$ is slightly lower than that of $M_1$ due to the higher doping level (lower channel mobility) of the $M_2$ channel region. Also, due to the symmetry of $M_1$ and $M_2$, the inverter characteristics are also symmetric. The $M_2$ inverter has a higher logic threshold than $M_1$ due to the integration of the gates and drains of the transistors FIG. 2). When the gate of $M_2$ is stepped up, the drain $D_2$ of $M_2$ will be at high voltage, and thus $M_1$ will be on because the gate $G_1$ of $M_1$ is also the drain $D_2$ of $M_2$. Current flows along $D_1 \equiv G_2$ and a voltage drop is established due to a relatively low doping level of $D_1 \equiv G_2$. Thus, a higher gate voltage is required by the $M_2$ inverter to switch. Maximizing the doping levels of the Sb-doped n-type regions helps to minimize this asymmetrical behavior.

Figure 7:
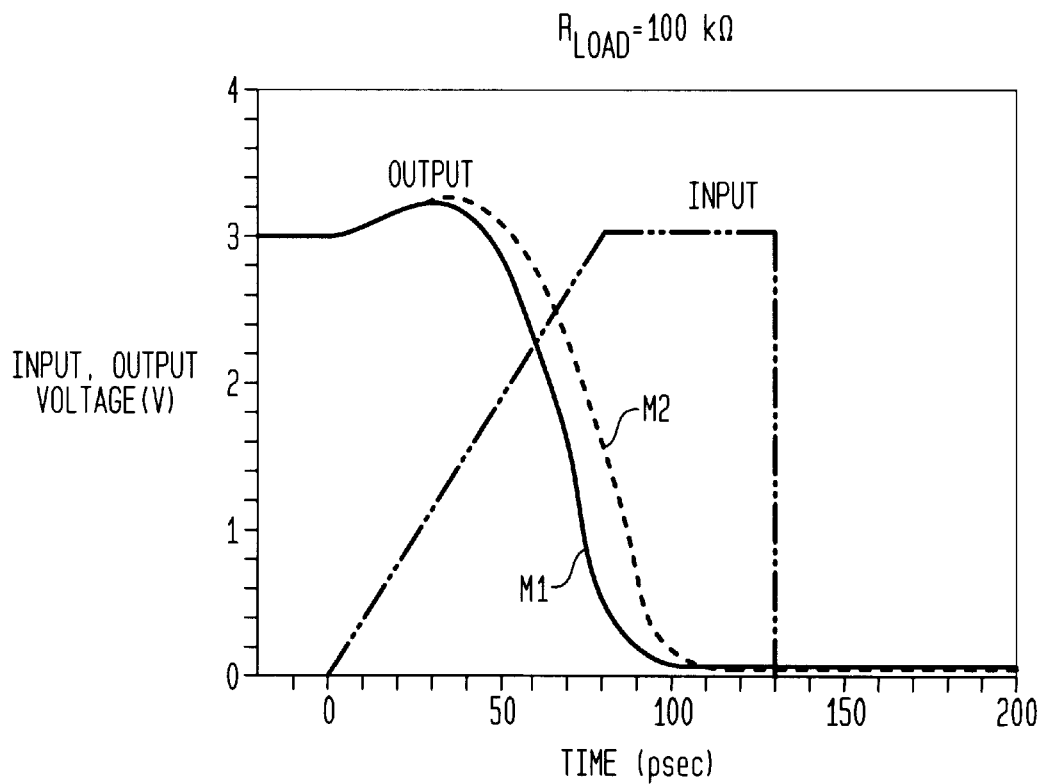
FIG. 7 is a graph showing transient switching characteristics of a SRAM cell having integrated transistors with the doping profile as shown in FIG. 4.

FIG. 7 illustrates the transient switching characteristics of a SRAM cell having integrated transistors as in FIG. 4 simulated with a drift-diffusion solver using 100 k Ω loads. For this simulation, only the intrinsic device capacitance embedded in the drift diffusion simulations were assumed, ignoring any parasitic contributions. Thus, FIG. 7 reflects only the intrinsic behavior of the structure. Simulations were performed by alternatively applying a positive bias pulse to one gate with the cell of that gate turned off and the cell of the other gate turned on, and then checking for the correct switching of the cell. In other words, a positive pulse was applied to the gate $G_1$ of $M_1$ where the cells $M_1$=off; $M_2$=on, and then a positive pulse was applied to the gate $G_2$of $M_2$where the cells $M_2$=off, $M_1$=on, and the cell switching was then checked. As can be seen from FIG. 7, an input voltage pulse of only 130 ps is sufficient to switch the memory cell in both configurations, although the switch is slower when the pulse is applied to the $M_2$ transistor. This difference again is due to the relatively low doping level of the $M_2$ gate region whose series resistance effectively slows down the switching of the cell. It is thus advantageous for this reason as well to maximize the doping levels of the Sb-doped n-type regions.

It is understood that the embodiments described herein are merely exemplary and that a person skilled in the art may make variations and modifications without departing from the spirit and scope of the invention. For example, although the invention has been described with reference to NMOS drive transistors, PMOS devices or an integration of PMOS and NMOS devices may be used as well. All such variations and modifications are intended to be included within the scope of the appended claims.

We claim:

1. A SRAM cell comprising a plurality of transistors wherein at least two of the transistors are monolithically integrated in a structure comprising a first semiconducting layer, a second semiconducting layer, and an insulating layer therebetween, the first and second semiconducting layers each comprising a source, drain, channel and gate to define first and second transistors, the insulating layer is disposed between the channel of the first transistor and the channel of the second transistor; and the gate of the first transistor functions as the drain of the second transistor and the gate of the second transistor functions as the drain of the first transistor.

2. The SRAM cell of claim 1 in which the insulating layer separates the channel of the first transistor from the channel of the second transistor.

3. The SRAM cell of claim 1 in which the first and second transistors each comprise NMOS devices.

4. The SRAM cell of claim 1 in which the first and second transistors each comprise PMOS devices.

5. The SRAM cell of claim 1 in which at least one of the first and second transistors comprises a PMOS device and the other of the first and second transistors comprises an NMOS device.

6. The SRAM cell of claim 1 in which the second semiconductor layer comprises a selective epitaxial lateral overgrowth layer.

7. The SRAM cell of claim 1 in which the insulating layer has a thickness of about 2 to 10 nm.

8. The SRAM cell of claim 1 in which the integrated structure comprises the insulating layer grown over the first semiconductor layer, the second semiconductor layer grown over the insulating layer, and the dopants being implanted in the integrated structure along channeling directions to form the gate and drain of the first and second transistors.

9. The SRAM cell of claim 8 in which the first semiconductor layer comprises a bulk silicon layer, the insulating layer comprises silicon dioxide, and the second semiconductor layer comprises an epitaxial silicon layer.

10. The SRAM cell of claim 8 in which the channeling directions are displaced by an angle of about 45 degrees from a vertical axial line running through the integrated structure and are disposed along latitudinal and longitudinal planes thereof.

11. The SRAM cell of claim 10 in which the dopants implanted along the latitudinal plane comprise arsenic ions for forming an $n^+$ region of the second transistor and the dopants implanted along the longitudinal plane comprise antimony ions for forming an $n^+$ region of the first transistor.

12. The SRAM cell of claim 10 in which the first and second transistors are substantially self-aligned by the dopants being implanted along the longitudinal and latitudinal planes with a single mask.

13. The SRAM cell of claim 12 in which the mask has a length substantially equal to the thickness of the second transistor.

14. A SRAM cell comprising a plurality of transistors, in which at least two of the plurality of transistors defining a first transistor and a second transistor each comprise a gate, source, drain, and a channel and are monolithically integrated with an insulating layer is disposed between the channel of the first transistor and the channel of the second transistor, wherein the drain of the first transistor functions as the gate of the second transistor and the drain of the second transistor functions as the gate of the first transistor and the insulating layer separates the channel of the first transistor from the channel of the second transistor to define an integrated transistor structure, wherein the integrated transistor structure is fabricated by (a) growing a layer of bulk silicon to form the first transistor, growing the insulating layer over the bulk silicon layer with selective epitaxial lateral overgrowth, and growing a layer of epitaxial silicon over the insulating layer to form the second transistor, and (b) implanting antimony and arsenic dopants in the layers defined by step (a) along first and second channeling directions, respectively, to form the gate and drain of the first and second transistors, the first channeling direction being displaced by an angle of about 45 degrees from a vertical axial line running through the integrated transistor structure and along a latitudinal plane thereof, and the second channeling direction being displaced by an angle of about 45 degrees from the vertical axial line and along a longitudinal plane thereof.

15. The SRAM cell of claim 14 in which a mask structure is used to implant the dopants, the mask has a length substantially equal to the thickness of the second transistor, and the same mask structure is used for the antimony and arsenic dopants.

16. A SRAM cell comprising a plurality of transistors including a first and a second transistor comprising:

a first semiconducting layer having dopants implanted therein to define a first source and a first drain for the first transistor a second semiconducting layer having dopants implanted therein to define a second source and a second drain for the second transistor, wherein the first drain of the first transistor functions as the gate of the second transistor and the second drain of the second transistor functions as the gate of the first transistor, and an insulating layer disposed between the first and second semiconducting layers, wherein the insulating layer separates the channel of the first transistor from the channel of the second transistor, and the first and second semiconducting layers and insulating layer define a monolithically-integrated structure.

* * * * *

UNITED STATES PATENT AND TRADEMARK OFFICE
CERTIFICATE OF CORRECTION

PATENT NO. : 6,144,073
DATED : Nov. 7, 2000
INVENTOR(S) : Gerhard Hobler, et al

It is certified that error appears in the above-identified patent and that said Letters Patent is hereby corrected as shown below:

On title page,

Enrico Sangiori needs to be changed to Enrico Sangiorgi.

Signed and Sealed this

Twenty-ninth Day of May, 2001

*Attest:*

NICHOLAS P. GODICI

*Attesting Officer*   *Acting Director of the United States Patent and Trademark Office*